United States Patent [19]
Arike et al.

[11] Patent Number: 5,486,655
[45] Date of Patent: Jan. 23, 1996

[54] MULTIPLE WIRE ADHESIVE ON A MULTIPLE WIRE WIRING BOARD

[75] Inventors: Shigeharu Arike, Tochigi; Yorio Iwasaki, Shimodate; Eiichi Shinada, Shimodate; Toshiro Okamura, Shimodate; Kanji Murakami, Mito; Yuichi Nakazato, Ibaraki, all of Japan

[73] Assignee: Hitachi Chemical Co., Ltd., Tokyo, Japan

[21] Appl. No.: 345,457

[22] Filed: Nov. 21, 1994

Related U.S. Application Data

[62] Division of Ser. No. 107,115, Aug. 17, 1993, Pat. No. 5,403,869.

[30] Foreign Application Priority Data

Aug. 17, 1992 [JP] Japan ..................................... 4-217814
Jul. 2, 1993 [JP] Japan ..................................... 5-164525

[51] Int. Cl.$^6$ ..................................................... H05K 1/02
[52] U.S. Cl. .......................... 174/259; 174/251; 174/262; 361/792
[58] Field of Search ..................................... 174/250, 251, 174/256, 259, 262, 263, 264, 265, 266; 361/784, 792

[56] References Cited

U.S. PATENT DOCUMENTS

| | | | |
|---|---|---|---|
| 3,646,572 | 2/1972 | Burr | 174/68.5 |
| 3,674,602 | 7/1972 | Keogh et al. | |
| 3,674,914 | 7/1972 | Burr | 174/68.5 |
| 4,097,684 | 7/1978 | Burr | 174/68.5 |
| 4,450,623 | 5/1984 | Burr | 174/251 X |
| 4,544,801 | 10/1985 | Rudik et al. | 174/251 |
| 4,646,436 | 3/1987 | Crowell et al. | 174/251 X |

*Primary Examiner*—Laura Thomas
*Attorney, Agent, or Firm*—Antonelli, Terry, Stout & Kraus

[57] ABSTRACT

An adhesive comprising (a) solid epoxy resin having a molecular weight of 5000 or more, (b) a polyfunctional epoxy resin having at least three epoxy groups, (c) an intramolecular epoxy modified polybutadiene having at least three epoxy groups, (d) a cationic photoinitiator, and (e) a tin compound in special weight ratios, is effective for producing multiple wire wiring boards having good heat resistance, solvent resistance wherein the adhesive layer has no voids and prevents shift of insulated encapsulated wires.

2 Claims, 3 Drawing Sheets

MULTIPLE WIRE ADHESIVE ON A MULTIPLE WIRE WIRING BOARD

BACKGROUND OF THE INVENTION

This application is a divisional application of application Ser. No. 08/107,115, filed Aug. 17, 1993, now U.S. Pat. No. 5,403,869.

This invention relates to an adhesive for multiple wire wiring boards using insulated encapsulated metal wires as circuit conductors, and to a multiple wire wiring board using said adhesive and a process for producing the same.

Multiple wire wiring boards produced by forming an adhesive layer on a substrate, wiring insulated encapsulated wires for forming conductor circuits on the adhesive layer, fixing the encapsulated wires, and connecting circuits between individual layers by through holes are disclosed, for example, in U.S. Pat. Nos. 4,097,684; 3,646,572; 3,674,914 and 3,674,602. These printed wiring boards are known to be advantageous in obtaining high density wiring, matching characteristic impedance and reducing crosstalk.

Ordinary multiple wire wiring boards are produced, for example as described in the above-mentioned U.S. patents, by forming an adhesive layer comprising a thermosetting resin, a curing agent and rubber on an insulating substrate, fixing insulated encapsulated wires in the adhesive layer, laminating a prepreg or the like, fixing the insulated encapsulated wires on the substrate, cutting insulated encapsulated wires at the portions necessary for connection, drilling holes through the substrate, and metallizing inner walls of the holes. In such processes, by fixing the insulated encapsulated wires in the substrate by means of lamination of the prepreg or the like, it is possible to prevent peeling of the insulated encapsulated wires at the time of drilling, and it is also possible to prevent lowering in reliability due to damage of the coating layer of insulated encapsulated wires at the plating step for forming a metal layer on the inner walls of holes after the step of drilling. Further, reasons for using the adhesive comprising a thermosetting resin, a curing agent and rubber as major components are to make it possible to form a film of an adhesive layer so as to make the handling during the production process easy, since the adhesive layer is prepared by coating an adhesive on a supporting film, followed by drying to form an adhesive sheet and is used by laminating on the insulating substrate or inner circuit boards after lamination of prepregs thereon, followed by lamination and adhesion; to have flexibility and to make it necessary to be non-adhesive except for the step of wiring. In addition, when wires are fixed on the adhesive layer, it is necessary to use an adhesive having a composition which can be activated by thermal energy produced by supersonic vibration, since the wires are contacted with the adhesive by a point of stylus which is vibrated by supersonics.

Recently, printed wiring boards including multiple wire wiring boards are becoming to have higher multi-layers and much finer in order to attain higher density mounting. When higher multi-layers and finer wiring are applied to the multiple wire wiring boards, it is very important to maintain certain insulation resistance between wires or between wires and inner layer circuits and positional precision of wires. That is, it is necessary to hold the insulation resistance between neighboring conductors high, and to prevent moving of wires at the step of wiring or after wiring, and the like. In a prior art technique, the insulation resistance was within the working errors so far as the wiring density was belong to that of prior art. As to the positional precision of wires, there was a moving of about 0.2 mm against the designed value after wiring and laminating adhesion of prepreg (hereinafter referred to as "wire swimming"), but since the wiring density was small, such a moving does not prevent the wiring boards from practical use. But with an increase of the wiring density as mentioned above, such a working error becomes to cause remarkable lowering in the insulation resistance. Further, when the positional precision of wires is as mentioned above, wires which should not be connected move to the positions to become through holes. As a result, such wires are cut at the time of drilling. When the inner walls of holes are metallized, there arises a problem in that such wires are connected to circuits other than the desired circuit conductors.

Reasons for lowering the insulation resistance and lowering the positional precision of wires are the use rubber as an adhesive. That is, the insulation resistance of rubber per ser is low, and after wiring, a prepreg or the like is laminated and adhered while retaining the fluidity of the adhesive.

In order to solve such a problem, there has been developed an adhesive comprising a phenoxy resin, an epoxy resin, a curing agent, a reactive diluent and a catalyst for electroless plating as an adhesive sheet as disclosed in Japanese Patent Examined Publication No. 2-12995. That is, by introducing a polymer component having high insulation resistance in place of the rubber of the adhesive mentioned above, the lowering of insulation resistance is suppressed.

On the other hand, the use of an adhesive using a photo initiator in the production of multiple wire wiring board is known as mentioned below.

Japanese Patent Unexamined Publication No. 62-20579 discloses an adhesive composition comprising a polymerized resin capable of forming a film, a polyfunctional compound having a polyaromatic skeleton, a curing agent capable of initiating the reaction by light or heat, a polyurethane having acrylic groups and bisphenol A-type epoxy resin as photocurable resins, and radical photopolymerization initiator, usable in a process wherein the adhesive is coated on insulated encapsulated wires.

U.S. Pat. No. 4,855,333 proposes a process comprising forming a photocurable adhesive layer in place of prior art thermosetting adhesive layer for wiring, pushing wires into the adhesive layer for wiring, followed by exposing the wiring portion and neighboring portion locally to light so as to cure only the wired portion. According to this process, the Storage Shear Modulus (G') at room temperature is 2 to 4 MPa, the Loss Angle Ratio (R), i.e. Loss shear Modulus (G")/(G') at room temperature is 0.3 to 0.7, and G' heated at lower than 150° C. at the time of wiring is 0.1 MPa or less. The photocurable adhesive used in this process is a radical polymerization type obtained by preliminary reacting bisphenol A type epoxy resin having a molecular weight of 1500 to 5000, a polyfunctional epoxy resin having a molecular weight of 900 to 1500 and acrylic acid, followed by addition of a polyfunctional acrylic resin and a photo initiator.

Japanese Patent Examined Publication No. 1-33958 discloses a process comprising wiring using a photocurable adhesive layer described in Examples of U.S. Pat. No. 4,855,333, and immediately after this, exposing the portion near the wires partially to light for curing.

On the other hand, various processes for curing epoxy resins are known. The following examples relate to cationic photo curing having very close relation to the present invention.

Japanese Patent Unexamined Publication No. 3-252488 discloses a photocurable adhesive composition comprising 100 parts by weight of epoxy resin, 3 to 20 parts by weight by intramolecular epoxy modified polybutadiene, 50 to 300 parts by weight of an inorganic filler, and a cationic photo initiator.

U.S. Pat. Nos. 4,173,551 and 4,275,190 disclose a combination of an aromatic diaryliodonium salt and a copper salt as a cationic polymerization initiator to activate thermosetting action of the initiator.

In order to obtain high density multiple wire wiring boards, the adhesive is required not to use a rubber component having low insulation resistance in order to prevent lowering of insulation resistance, to enhance the positional precision of wires, and to have flexibility, to be able to conduct film formation and to maintain non-sticking properties in order to use previously used manufacturing apparatuses and production processes as much as possible.

In order to prevent the lowering of insulation resistance, for example, Japanese Patent Examined Publication No. 2-12995 discloses an adhesive comprising a polymer component in place of a rubber component and a plasticizer, a solvent or a diluent so as to make it possible to obtain flexibility and film formation. According to this reference, by employing a step of preheating between a wiring step and a press step, the wire swimming is prevented by slightly curing the adhesive layer. But in this preheating step, the viscosity of adhesive layer is temporally lowered to release the stress accumulated on wires, resulting in causing a problem that the wires float and cause misregistration. In order to prevent these problems, when a curing agent having high reactivity, there arise another problems in that the shelf life of adhesive is shortened, and the like.

Further, in the course of improvement of adhesives, there arises another necessity to excellently suppressing the generation of voids in addition to satisfaction of the above-mentioned requirement. That is, on the surface of substrate wired in high density, there is a large relief due to insulated encapsulated wires. Further, at the crossing portions of insulated encapsulated wires, there are many spaces without an adhesive layer. When cured as they are, such spaces remain as voids, resulting in causing short circuit in through holes, lowering resistance to electrolytic corrosion and lowering insulation resistance.

On the other hand, in order to enhance the positional precision of wires, it is necessary to cure the adhesive layer completely immediately after wiring. As such a process, Japanese Patent Examined Publication No. 1-33958 discloses a process wherein a photocurable adhesive layer is used and a wired portion is cured by exposure to light. But, the crossing portions of insulated encapsulated wires cause great relief as mentioned above to generate spaces without the adhesive layer. When cured completely without removing such spaces, the spaces are retained as they are, resulting in causing a great problem, particularly in the case of forming very fine circuits.

According to prior art techniques, there was a problem in that it was difficult to attain both the enhancement of positional precision of wires and removal of voids in order to produce multiple wire wiring boards with high wiring density.

In addition, the use of photocurable adhesives has various problems. In the production of multiple wire wiring boards, a protective film is peeled from an adhesive layer formed on a substrate and wiring working is sometimes conducted for several hours. When a radical photopolymerization initiator as disclosed in Japanese Patent Unexamined Publication No. 62-20579 is used, since the radical photopolymerization is inhibited by the oxygen in the air at the surface portion of the adhesive layer, the adhesive layer at the surface portion is not cured, resulting in causing a problem of lowering in heat resistance. Further, when a known photocurable adhesive for multiple wire wiring boards is used, since the glass transition temperature is low, there is a problem in that the reliability as the substrate is low.

SUMMARY OF THE INVENTION

It is an object of the present invention to provide an adhesive for high density multiple wire wiring boards, said adhesive having flexibility and film forming properties necessary for using as an adhesive sheet, having non-sticking properties except for the step of wiring and necessary for production using known apparatuses, and being excellent in positional precision of wires and prevention of voids in order to make it possible to produce high density wiring. It is another object of the present invention to provide a multiple wire wiring board produced by using said adhesive and a process for producing the same.

The present invention provides an adhesive for multiple wire wiring boards, which comprises (a) an epoxy resin having a molecular weight of 5000 or more and being solid at room temperature, (b) a polyfunctional epoxy resin having at least three epoxy groups, (c) an intramolecular epoxy modified polybutadiene having at least three epoxy groups, (d) a cationic photopolymerization initiator, and (e) a tin compound, wherein the weight ratio of (a+b+c) to (a) is 100:40 to 100:70, the weight ratio of (a+b+c) to (b) is larger than 100:10, the weight ratio of (a+b+c) to (c) is 100:10 to 100:40 and the weight ratio of (a+b+c) to (d) is 100:0.5 to 100:5.

The present invention also provide a multiple wire wiring board comprising a substrate having a conductor circuit thereon or insulating substrate, an adhesive layer formed on one or both surfaces of the substrate, insulated encapsulated wires fixed on the adhesive layer, through holes formed in necessary portions of the substrate, and conductor circuits formed on necessary portions of outmost surfaces of the substrate, said adhesive layer being formed by using the adhesive mentioned above.

The present invention further provide a process for producing a multiple wire wiring board, which comprises forming an adhesive layer for fixing wires on one or both surfaces of a substrate having conductor circuits thereon or an insulating substrate, wiring insulated encapsulated wires on the adhesive layer, fixing the wires on the adhesive layer, drilling holes at necessary portions of the substrate, and forming metallized through holes and conductor circuits on necessary portions of the surfaces of the substrate, said adhesive layer being formed by using the adhesive mentioned above.

DESCRIPTION OF THE PREFERRED EMBODIMENTS

The multiple wire wiring board and the process for producing the same of the present invention is characterized by forming an adhesive layer on an insulating substrate using the adhesive resin composition explained below, wiring insulated encapsulated wires on the adhesive layer, slightly curing the adhesive layer with exposure to light insufficient for complete curing, pressing the resulting substrate with heating, exposing to light again to cure the adhesive layer almost completely to fix the insulated wires on the adhesive layer.

The process for producing the multiple wire wiring board of the present invention is explained referring to FIGS. 1A to 1F.

Figure 1A:
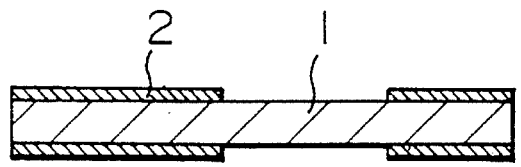
FIGS. 1A to 1F are cross-sectional views explaining one example of production steps of the present invention.

FIG. 1A is a cross-sectional view of an insulating substrate 1 with inner layer copper circuit 2 previously formed. This circuit can be formed, for example, by subjecting a copper-clad laminate of glass cloth-epoxy resin or glass cloth-polyimide resin to a conventional etching method, and the like. If necessary, the inner layer circuit can become a multiple-layer circuit, or can be omitted.

Figure 1B:
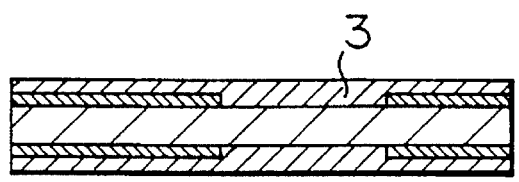

FIG. 1B shows the formation of an underlay layer 3 as an insulating layer. The underlay layer is formed so as to improve resistance to electrolytic corrosion and to match impedance, or can be omitted if unnecessary. the underlay layer can be formed by using a B stage prepreg of conventional glass cloth-epoxy resin or glass cloth-polyimide resin, or a B stage resin sheet containing no glass cloth. Such a resin layer can be cured upon necessity or cured by pressing after laminated on the substrate.

Figure 1C:
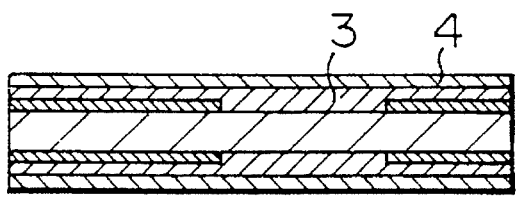

FIG. 1C shows the formation of an adhesive layer 4 for wiring and fixing insulated encapsulated wires thereon using the above-mentioned photocurable adhesive. The adhesive layer can be formed by directly coating the adhesive on the insulating substrate followed by drying. When a conventional coating method such as spray coating, roll coating, screen printing, etc., the film thickness becomes non-uniform, resulting in making the characteristic impedance undesirably non-uniform when formed into a multiple wire wiring board. In order to obtain the adhesive layer having a uniform film thickness, it is preferable to employ a process wherein an adhesive is once coated on a carrier film of polypropylene or polyethylene terephthalate by roll coating, followed by drying to form a dry film, which is then laminated on an insulating substrate by hot roll or pressing. Further, the dry film of coating film is required to have good flexibility suitable for being rolled or cut in desired size, and non-sticking properties so as not to include bubbles at the time of lamination on the substrate.

Figure 1D:
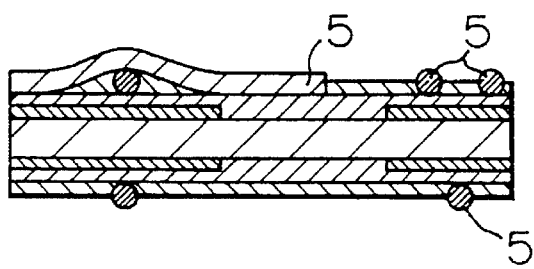

Then, insulated encapsulated wires 5 are wired as shown in FIG. 1D. Wiring can generally be conducted with heating while supplying supersonic vibration using a wiring machine. By this, the adhesive layer is softened to bury the wires in the adhesive layer. But when the melt viscosity of the adhesive layer is too low, an insulated encapsulated wire is often peeled from the adhesive layer at the end portion of the insulated encapsulated wire, or the insulated encapsulated wire is often twisted at a corner portion wherein the insulated encapsulated wire is bent at a right angle, resulting in sometimes failing the obtain sufficient precision.

On the other hand, when the melt viscosity of the adhesive layer is too high, the wires are insufficiently buried in the adhesive layer at the time of wiring. Since the adhesive strength between the wire and the adhesive layer is small, the wire is often peeled off or a wire under an upper wire at a crossing portion is moved by the pressure of upper wire to cause misregistration. Therefore, it is necessary to control the melt viscosity of adhesive in a proper range at the time of wiring.

As the wires for wiring, there are used insulated encapsulated wires so as to prevent short circuit even if wired crosswise on the same plane. As the core material of wires, there can be used copper or copper alloy, which is coated with polyimide. In order to enhance adhesive strength of crossing portions of wires, it is possible to form a wire adhesive layer outside the insulated coating layer. As the wire adhesive layer, there can be used a thermoplastic, thermosetting or photocurable material.

After wiring, the adhesive layer is exposed to light to proceed the curing of the adhesive layer in order to prevent transfer and move of the wires. At this time, when the curing proceeds too much, retention of voids generates; this is a problem. On the other hand, when the curing is insufficient, the wires will move in the next pressing step. Thus, it is necessary to suitably control the degree of curing reaction of the adhesive layer. The degree of curing reaction changes depending on the kind of materials used. It is necessary to employ the most suitable value for each material.

After partial curing with light, pressing with heating is conducted. By this the level difference of the surface of the wired substrate is reduced and voids retained in the adhesive layer are removed. Voids in the adhesive layer are produced during wiring with heating of wires by supersonics, or spaces produced near the crossing portion of wires. Thus, it is necessary to smooth the wired substrate surface by pressing with heating and to remove the voids in the adhesive layer. After pressing with heating, the adhesive layer is exposed to light sufficiently, and if necessary with heating, and cured almost completely.

Figure 1E:
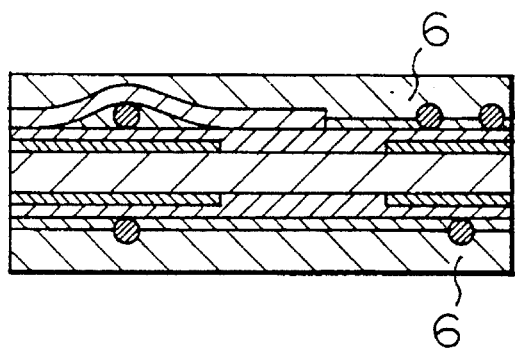

Then, in order to protect the wired wires, an overlay layer 6 is formed as shown in FIG. 1E. As the overlay layer, there can be used a conventional thermosetting or photocurable resin or a resin containing glass cloth. Then, the resulting substrate is finally cured. In order to reducing the number of steps, it is possible to conduct the pressing with heating and the formation of overlay layer simultaneously. In this case, after formation of the overlay layer, it is possible to cure the photocurable material of the adhesive layer by exposing to light through the overlay layer, if necessary.

Figure 1F:
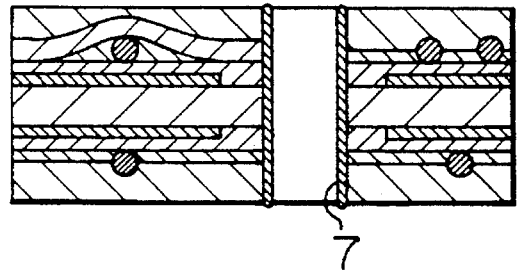
Figure 2:
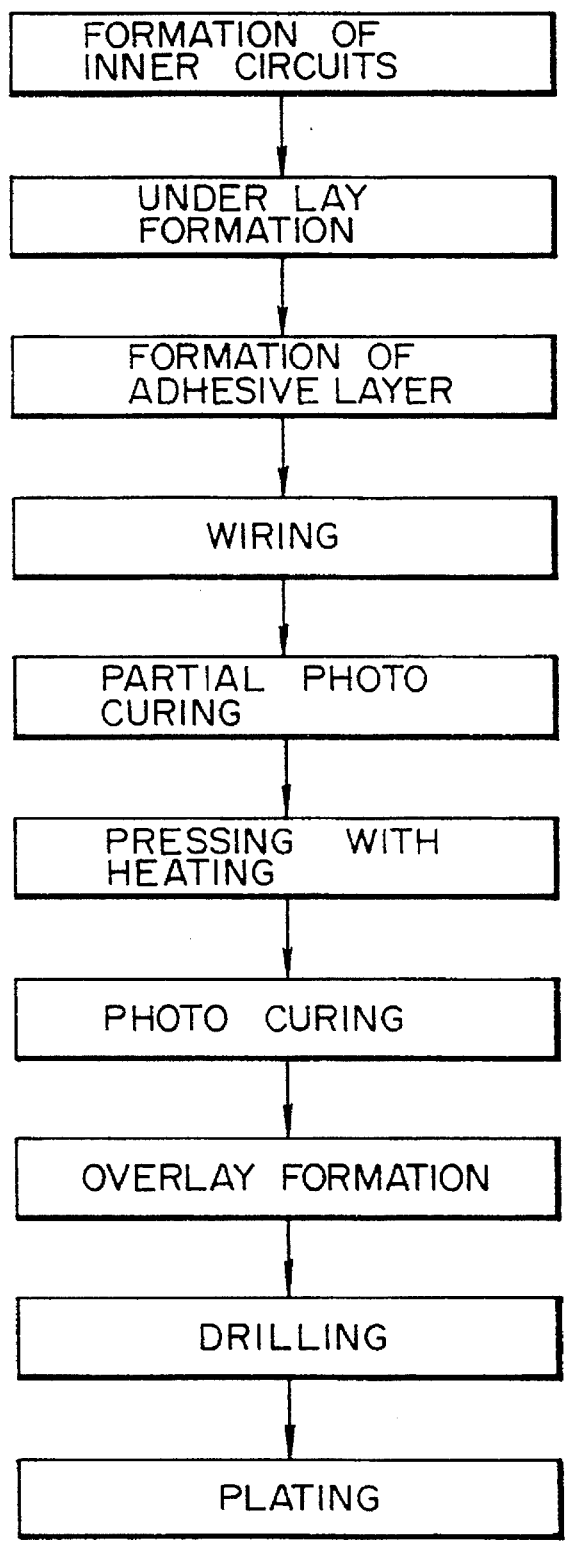
FIG. 2 is a flow chart showing one example of production steps of the present invention.

After drilling holes, through hole plating is conducted to complete the multiple wire wiring board as shown in FIG. 1F. In this case, before drilling holes, a copper foil can be adhered to the surface via a prepreg at the time of formation of overlay to produce a multiple wire wiring board having a surface circuit.

The adhesive used for producing the multiple wire wiring board comprises (a) an epoxy resin having a molecular weight of 5000 or more and being solid at room temperature, (b) a polyfunctional epoxy resin having at least three epoxy groups, (c) an intramolecular epoxy modified polybutadiene having at least three epoxy groups, (d) a cationic photopolymerization initiator, and (e) a tin compound, wherein the weight ratio of (a+b+c) to (a) is 100:40 to 100:70, the weight ratio of (a+b+c) to (b) is larger than 100:10, the weight ratio of (a+b+c) to (c) is 100:10 to 100:40, and the weight ratio of (a+b+c) to (d) is 100:0.5 to 100:5.

Each component of the adhesive is explained below.

(a) Epoxy resin having a molecular weight of 5000 or more and being solid at room temperature As the epoxy resin having a molecular weight of 5000 or more and being solid at room temperature, there can be used bisphenol A type epoxy resins such as Epikote 1010, Epikote 1009, Epikote 1007 (mfd. by Yuka Shell Epoxy Co., Ltd.), DER 669, DER 667 (mfd. by Dow Chemical Co., Ltd.), Epotohto YD 7020, 7019, 7017 (mfd. by Tohto Kasei Co., Ltd.); phenoxy resins such as UCAR Phenoxy resin PKHH, PKHJ, PKHC (mfd. by Union Carbide Co., Ltd.), Phenotohto YP-50 (mfd. by Tohto Kasei Co., Ltd.), Eponol 53-B-40, 55-B-40 (mfd. by Yuka Shell Epoxy Co., Ltd.).

The epoxy resin having a molecular weight of 5000 or more and being solid at room temperature is used in the range of 40 to 70 parts by weight based on the total weight of the resin components in order to obtain a coating with uniform film thickness and to maintain the melt viscosity in a proper range at the B stage of the adhesive layer at the time of wiring. When the amount is less than 40 parts by weight, it is difficult to obtain the coating with uniform film thickness, the flexibility of coating film is lost, resulting in failing to be used as a dry film. When the amount is more than 70 parts by weight, the crosslinking density is lowered, swelling for a solvent easily takes place, and heat resistance is lowered due to lowering in glass transition temperature Tg.

(b) Polyfunctional epoxy resin having at least three epoxy groups

As the polyfunctional epoxy resin having at least three epoxy groups, there can be used novolak type epoxy resins such as Epikote 180, Epikote 157 (mfd. by Yuka Shell Epoxy Co., Ltd.), UVR-6610, UVR-6620, UVR-6650 (mfd. by Union Carbide Co., Ltd.); polyfunctional epoxy resins such as TACTIX 742 (mfd. by Dow Chemical Co., Ltd.), Techmore VG 3101L (mfd. by Mitsui Petrochemical Co., Ltd.), etc.

Since these resins have three or more epoxy groups which can become crosslinking points in one molecule, three-dimensional crosslinking is possible and a cured product having a high crosslinking density can be obtained. Further, since these resins have good compatibility with the epoxy resin solid at room temperature and an epoxy resin liquid at room temperature explained hereinafter, it is possible to obtain a uniform mixture. The component (b) is used in an amount of 10 parts by weight or more per 100 parts by weight of the total resin components. When the amount is less than 10 parts by weight, improvement of crosslinking density after cured cannot be attained.

(c) Intramolecular epoxy modified polybutadiene having at least three epoxy groups As the intramolecular epoxy modified polybutadiene, there can be used those which have good compatibility with the above-mentioned epoxy resins and have at least three epoxy groups in one molecule, for example, poly pd R45EPI, poly pd R15EPI (mfd. by Idemitsu Petrochemical Co., Ltd.). These resins are more reactive than the above-mentioned epoxy resins in the cationic polymerization reaction, and have good compatibility with the epoxy resin which is solid at room temperature, the polyfunctional epoxy resin and the epoxy resin which is liquid at room temperature as mentioned below. Thus, uniform mixing is possible.

By using the component (c) with the epoxy resin (a) and the polyfunctional epoxy resin (b), control of the degree of curing can be conducted easily and both precise fixing of wires and removal of voids become easily possible.

That is, after dry with heating for obtaining a dry film and wiring of wires, the adhesive layer is exposed to light. The degree of curing at the time of partial curing of the adhesive layer should be controlled at the degree so as to conduct both of precise fixing of wires and removal of voids, considering the subsequent step. In order to control such a degree of curing, the use of a combination of epoxy resins having the same rates of curing is undesirable due to difficulty of control. According to the present invention, by co-using the epoxy resin having a higher reactivity than the above-mentioned epoxy resins, the control of degree of curing can easily be conducted. Such effects cannot be obtained when the component (c) is used outside the amount of 10 to 40 parts by weight per 100 parts by weight of the total of resin components.

(d) Cationic photopolymerization initiator

As the cationic photopolymerization initiator for curing the epoxy resins, there can be used blocked Lewis acid catalysts, aromatic diazonium salts, aromatic diaryliodonium salts, aromatic sulfonium salts, etc. Among them, the use of aromatic sulfonium salts such as UVI-6970, UVI-6974, UVI-6950, UVI-6990 (mfd. by Union Carbide Co., Ltd.), SP-170, SP-150 (mfd. by Asahi Denka Kogyo K.K.) is preferable. These initiators can carry out cationic polymerization of epoxy groups even with heating.

The cationic photopolymerization initiator is need in an amount of 0.5 to 5 parts by weight per 100 parts by weight of the total resin components. When the amount is less than 0.5 part by weight, the curing reaction by exposure to light is difficult to proceed, while when the amount is more than 5 parts by weight, the insulation properties is lowered.

(e) Tin compound

As the tin compound, there can be used inorganic tin compounds such as stannous chloride, stannic chloride, stannous oxide, stannic oxide, etc., and organic tin compounds such as dibutyltin laurate, dibutyltin dimethoxide, dibutyltin dioxide, etc. These compounds can also be used after adsorbed on inorganic fillers.

The tin compound is particularly important in the present invention. The tin compound acts on a cationic polymerization catalyst such as a sulfonium salt to make it unstable against heat, resulting in becoming a catalyst which causes cationic polymerization with heating.

This tin compound is also included in a catalyst for electroless plating used for metallizing inner walls of through holes in the production of multiple wire wiring boards using this adhesive. This is because when palladium which becomes a catalytic metal is adsorbed on a carrier, the carrier is immersed in a solution of palladium compound and palladium is reduced to metallic element by a solution of tin compound, so that the tin compound is also adsorbed on the carrier. In the case of electroless plating, since the amount of tin compound is very small, the tin compound is not removed due to causing no trouble.

The adhesive disclosed in the above-mentioned Japanese Patent Unexamined Publication No. 62-20579 contains a tin compound, CAT #10 (mfd. by Kollmorgen Co.), which is a catalyst for electroless plating. Since this tin compound is used as a catalyst for electroless plating, this reference is quite silent on the catalytic activity of tin compound for thermosetting reaction.

Reasons for using the tin compound in the present invention are as follows: when the adhesive used in the present invention includes only (a) an epoxy resin having a molecular weight of 5000 or more and being solid at room temperature, (b) a polyfunctional epoxy resin having at least three epoxy groups, (c) an intramolecular epoxy modified polybutadiene having at least three epoxy groups, and (d) a cationic photopolymerization initiator, end portions of wires are often peeled at portions wherein a large number of wires are wired or a number of crossing points of wires are present.

This peeling is caused by the low melt viscosity of the adhesive at the time of wiring. In order to prevent this peeling, it is necessary to enhance the melt viscosity of the adhesive. But when the component (a) of epoxy resin having a molecular weight of 5000 or more is increased, the solvent resistance and heat resistance are lowered as mentioned above. Further, when the adhesive layer is exposed to weak light so as to control the degree of curing and not to be cured completely, only near the surface of adhesive is cured to lower the adhesive strength between the wires and the adhesive, resulting in giving no good wiring properties.

In contrast, when the tin compound is added, it is possible to proceed considerably a curing reaction by heat at the time of forming the adhesive layer. Since the curing by heat can prevail in whole the adhesive, it is possible to conduct weak curing of the adhesive uniformly without lowering wiring properties.

The adding amount of tin compound changes depending on the kind of compound used. It is necessary to determine the adding amount of tin compound by previous experiments. Since good conditions for wiring properties, or conditions for obtaining flexibility necessary for adhesive layer used in the multiple wire wiring boards change depending on the adding amounts, it is necessary to select suitable amounts under heating conditions for obtaining both good conditions for wiring properties and conditions for obtaining the flexibility simultaneously. This heating conditions determine the drying conditions for obtaining adhesive sheets and the heating conditions for laminating and adhering the insulating substrate or inner layer circuit boards, and also relate to the heating temperature and heating time. When the heating temperature is undesirably low or the heating time is undesirably short, the solvent contained in the adhesive varnish cannot be vaporized sufficiently, resulting in lowering heat resistance, or after wiring, the addition of a step for vaporizing the solvent sufficiently is necessitated.

Figure 3:
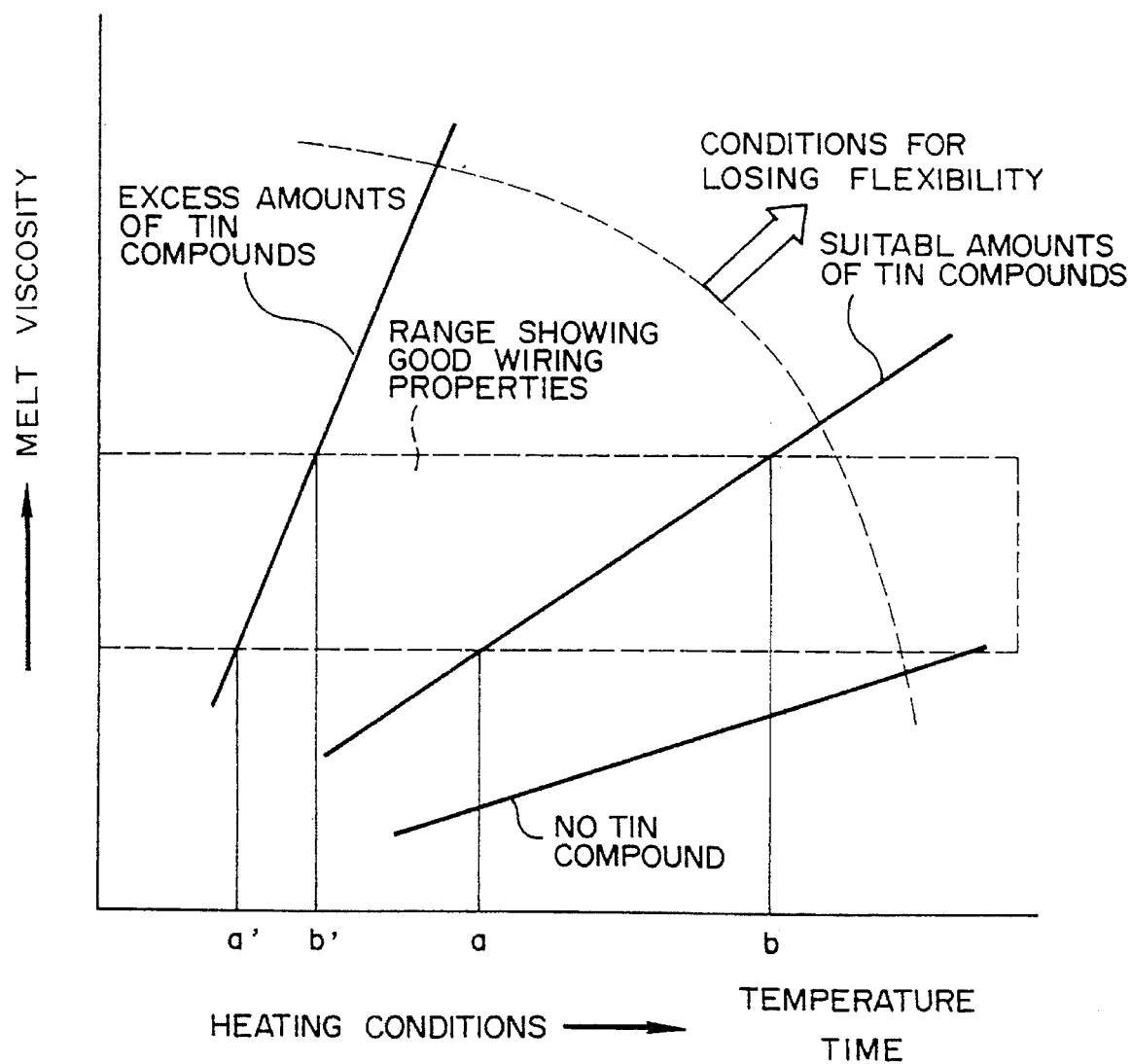
FIG. 3 is a graph explaining features of the present invention.

The above-mentioned relations are shown in FIG. 3. The heating conditions are taken along the abscissa axis and the melt viscosity which influences wiring properties is taken along the ordinate axis. The area with oblique lines shows a region good in wiring properties. In FIG. 3, a region difficult for use due to lack of flexibility is also shown.

As is clear from FIG. 3, when no tin compound is used, there is no heating conditions good in both the wiring properties and flexibility. When the amount of tin compound is large, the heating conditions good in both wiring properties and flexibility are present between a' and b' but its range is narrow. Further, the amount of solvent retained in the adhesive becomes large.

When the amount of the tin compound is suitable, the heating conditions good in both wiring properties and flexibility are present between a and b and the range is wide. Generally speaking, it is preferable to control the gel time of varnish at 150° C. to about 200 seconds as shown in Table 1 of examples shown below.

As a substance which can proceed the curing reaction even by heat, there can be used conventionally used ones. But the use of imidazoles and amines such as dicyandiamide which are anionic polymerization initiators used as curing agents for epoxy resins is not preferable due to inhibition of photocuring action of cationic photopolymerization initiators.

(f) Filler

If necessary, in order to control flow properties of adhesive, it is effective to add to the adhesive a filler such as mica, finely ground silica, zirconium silicate, magnesium silicate, titanium white, etc. Further, it is possible to add a conventional catalyst for electroless plating in order to improve plating adhesiveness of inner walls of through holes and to produce a wiring board by an additive process.

(g) Epoxy resin which is liquid at room temperature

It is possible to add an epoxy resin which is liquid at room temperature to the adhesive. Examples of the liquid epoxy resin are bisphenol A type epoxy resin such as Epikote 828, Epikote 825 (mfd. by Yuka Shell Epoxy Co., ltd.), UVR-6405, UVR-6410 (mfd. by Union Carbide Co., Ltd.); Epikote 801, Epikote 802, Epikote 815 added with a reactive diluent (mfd. by Yuka Shell Epoxy Co., ltd.); bisphenol F type epoxy resins such as Epikote 807 (mfd. by Yuka Shell Epoxy Co., Ltd.), YDF 170 (mfd. by Tohto Kasei Co., Ltd.), UVR-6490 (mfd. by Union Carbide Co., Ltd.); and aliphatic epoxy resins such as Denacol EX-821, EX-512, Ex-313 (mfd. by Nagase Chemicals Co., Ltd.), etc.

In the present invention, the above-mentioned components, that is, (a) an epoxy resin having a molecular weight of 5000 or more and being solid at room temperature, (b) a polyfunctional epoxy resin having at least three epoxy groups, (c) an intramolecular epoxy modified polybutadiene having at least three epoxy groups, and (d) a cationic photopolymerization initiator are mixed in an organic solvent so as to make the weight ratios as follows:

(a+b+c): (a)=100:40 to 100:70,
(a+b+c): (b)=100:10 or more,
(a+b+c): (c)=100:10 to 100:40, and
(a+b+c): (d)=100:0.5 to 100:5.

As the organic solvent, there can be used methyl ethyl ketone, acetone, toluene, xylenes, methyl isobutyl ketone, ethyl acetate, methyl Cellosolve, acetate Cellosolve, etc., singly or as a mixture thereof.

The present invention is illustrated by way of the following Examples, in which all parts and percents are by weight unless otherwise specified.

EXAMPLES 1 TO 3, COMPARATIVE EXAMPLES 1 TO 9

Adhesive compositions and properties of Examples 1 to 3 and Comparative Examples 1 to 9 are listed in Table 1. The adhesive compositions shown in Table 1 and the production process of multiple wire wiring boards using these adhesives are explained below.

[Adhesive compositions]

(a) Epoxy resin having a molecular weight of 5000 or more
  Epikote 1010 (molecular weight: about 9000, mfd. by Yuka shell epoxy Co., Ltd.)

(b) Polyfunctional epoxy resin having at least 3 epoxy groups
  Epon 180S65 (o-cresol novolac resin base, mfd. by Shell Chemical Co., Ltd.)

(c) Intramolecular epoxy modified polybutadiene having at least 3 epoxy groups
  Poly pd R45EPI (molecular weight: about 3000, epoxy equivalent weight: about 200, mfd. by Idemitsu Petrochemical Co., Ltd.)

(d) Cationic photoinitiator
  UVI-6970 (arylsulfonium salt of hexafluorotimonate, mfd. by Union Carbide Co., Ltd.)

(e) Tin compound

Metallic palladium and tin compound adsorbed on an inorganic filler

Catalyst for electroless plating CAT#4 (mfd. by Hitachi Chemical Co., Ltd.), or dibutyltin dilaurate (g) Liquid epoxy resin UVR 6490 (bisphenol F-based epoxy resin, mfd. by Union Carbide Co., Ltd.)

(f) Filler

Crystalite VX-X (silicon dioxide powder, mfd. by Tatsumoi Kabushiki Kaisha) in an amount of 18 parts and 2 parts of powdery silica.

(h) Organic solvent

A mixed solution of 50 parts of methyl ethyl ketone (mfd. by Wako Pure Chemical Industries, Ltd.) and 50 parts of xylene (mfd. by Wako Pure Chemical Industries, Ltd.) was used for dissolving the above-mentioned components to give a varnish.

[Production process]

(1) Formation of coating film (dry film)

A varnish having the above-mentioned composition as listed in Table 1 was coated on a polyethylene terephthalate (PET) film subjected to release treatment as a substrate for transferring so as to make the film thickness 100 μm after dried, and dried at 120° C. for 10 minutes to prepare an adhesive sheet.

(2) Formation of substrate

A double-sided copper-clad laminate of glass cloth-epoxy resin MCL-E-168 (a trade name, mfd. by Hitachi Chemical Co., Ltd.) was subjected to a conventional etching method to form a circuit. Then, a pair of glass cloth-epoxy resin prepregs (GEA-168, a trade name, mfd. by Hitachi Chemical Co., Ltd.) were pressed on both sides of the substrate and cured to form underlay layers.

(3) Wiring

Lamination

A pair of film-like adhesive sheets obtained in above (1) were hot roll laminated on both sides of the substrate at a roll temperature of 100° C., and moving speed of 0.4 m/min to form adhesive layers.

Wiring

After removing the release treated PET films, polyimide encapsulated wires (Wire HAW, diameter of copper wire 0.1 mm, mfd. by Hitachi Cable, Ltd.) were wired on one surface after another of the substrate using a wiring machine while applying supersonic heating.

(4) Photocuring of adhesive layer/pressing

After wiring, the adhesive layers on both sides were exposed to light using a high-pressure mercury lamp at 500 mJ/cm$^2$. Then, the resulting substrate was pressed with heating using silicone rubber as a cushion material at 130° C. for 30 minutes under 20 Kgf/cm$^2$. Subsequently, the both sides were subjected to exposure to light using a high-pressure mercury lamp at 3 J/cm$^2$ to cure the adhesive layers.

(5) Insulation

Then, a pair of glass cloth-epoxy resin prepregs (GEA-168, a trade name, mfd. by Hitachi Chemical Co., Ltd.) were applied on both sides of the resulting substrate, pressed and cured to form overlay layers.

(6) Drilling/through hole formation

Then, a pair of polyethylene films were laminated on the surfaces of overlay layers, followed by drilling at desired portions.

After drilling, pretreatment such as hole cleaning was conducted, followed by immersion in an electroless copper plating solution to conduct through hole plating with 30 μm in thickness. After removing the polyethylene films, a multiple wire wiring board was produced.

Properties of adhesives for multiple wire wiring boards produced in Examples 1 to 3 and Comparative Examples 1 to 9 were measured. The results are shown in Table 1.

TABLE 1

| | | Example | | | Comparative Example | | | | | | | | |
|---|---|---|---|---|---|---|---|---|---|---|---|---|---|
| | Example No. | 1 | 2 | 3 | 1 | 2 | 3 | 4 | 5 | 6 | 7 | 8 | 9 |
| Adhesive components | (a) | 50 | 50 | 50 | 0 | 60 | 60 | 60 | 80 | 40 | 50 | 50 | 50 |
| | (b) | 30 | 30 | 30 | 80 | 40 | 0 | 0 | 10 | 10 | 30 | 30 | 30 |
| | (c) | 20 | 20 | 20 | 20 | 0 | 40 | 0 | 20 | 50 | 0 | 20 | 20 |
| | (d) | 3 | 3 | 3 | 3 | 3 | 3 | 3 | 3 | 3 | 3 | 3 | 3 |
| | (e) CAT#11 | 3 | 0 | 3 | 3 | 3 | 3 | 3 | 3 | 3 | 3 | 0 | 10 |
| | Dibutyltin laurate | 0 | 0.5 | 0 | 0 | 0 | 0 | 0 | 0 | 0 | 0 | 0 | 0 |
| | (g) | 0 | 0 | 10 | 0 | 0 | 0 | 40 | 0 | 0 | 20 | 0 | 0 |
| | (f) | 20 | 20 | 20 | 20 | 20 | 20 | 20 | 20 | 20 | 20 | 20 | 20 |
| Properties | Gel time of varnish at 150° C. | 200 | 180 | 210 | — | — | — | — | — | — | — | 2000 | 60 |
| | Dynamic viscoelastic modulus at B stage (MPa) | 700 | 500 | 400 | — | — | — | — | — | — | — | — | — |
| | Loss angle ratio at B stage | 0.5 | 0.6 | 0.5 | — | — | — | — | — | — | — | — | — |
| | Wiring properties at B stage | ○ | ○ | ○ | — | — | — | x | ○ | ○ | x | x | x |
| | Glass transition point at C stage (Tg) (°C.) | 117 | 116 | 117 | 130 | 120 | 103 | 110 | 100 | 105 | 119 | 112 | 120 |
| | Solvent resistance at C stage (min) | 60 | 60 | 60 | — | — | — | — | 10 | — | — | 60 | 60 |

13

Comparative Examples 1 and 2 were poor in flexibility at the state of dry film and cracks were generated by slight bending. In Comparative Examples 4 and 7, when the adhesives were heated at 140° C. for 10 minutes in addition to the above-mentioned conditions, the wiring properties were improved but the flexibility was lowered. In Comparative Examples 3, 5 and 6, the glass transition point (Tg) was lower than the rest of the adhesive compositions.

In Examples 1, 2 and Comparative Examples 8 and 9, the kind of tin compounds and their amounts were changed. Comparing Comparative Examples 8 and 9 with Example 1, with an increase of the amount of tin compound, the gel time of varnish at 150° C. was shortened. Further, in order to obtain the same value of the gel time of varnish at 150° C., the adding amounts were changed depending on the kind of compounds used.

In Comparative Example 8 wherein no tin compound was added, the wiring properties were not improved even if exposed to ultraviolet light of 100 mJ/cm$^2$ so as not to completely be cured (about 3 J/cm$^2$) after lamination of the adhesive layer on the substrate.

Properties shown in Table 1 were measured as follows.
[Dynamic viscoelastic modulus]

The modulus of elasticity measured at frequency of 10 Hz and amplitude of 5 μm was defined as 'dynamic viscoelastic modulus' G' (MPa), and the energy lost by viscosity properties was defined as 'loss modulus' G" (MPa), and then the ratio R=G'/G" was measured using DVE-Ve (mfd. by Kabushiki Kaisha Phenology).

According to U.S. Pat. No. 4,855,333 (=Japanese Patent Examined Publication No. 1-48671), more preferable dynamic viscoelastic modulus at room temperature is: R=0.3 to 0.7, G' (dynamic viscoelastic modulus)=2 to 4 MPa, and G' at 150° C. or less is 0.1 MPa or less.

In the present invention, the value of R at the room temperature is almost the same as that of above-mentioned U.S. Patent, but good properties such as wiring properties are obtained at G'=400 MPa or more.
[Wiring properties]

For evaluating the wiring properties, when an adhesive layer under a wired wire was peeled it was evaluated as 'O' and when peeled, it was evaluated as 'x', and listed in Table 1.

In Comparative Examples 1 and 2, since the flexibility was poor, wiring could not be conducted. In Comparative Example 3, since Tg was unpractically low, no data were taken.

14

EXAMPLE 4, COMPARATIVE EXAMPLES 10 TO 12

Using the adhesive composition of Example 1 and the same production conditions as described in Example 1 except for the process conditions (4) listed in Table 2, multiple wire wiring boards were produced.

The positional precision of wires and prevention of voids were tested under the conditions mentioned above. The results are shown in Table 2.

TABLE 2

|  |  | Example No. | | | |
| --- | --- | --- | --- | --- | --- |
|  |  | Comparative Example 10 | Example 4 | Comparative Example 11 | Comparative Example 12 |
|  |  | Reference No. | | | |
|  |  | 1 | 2 | 3 | 4 |
| Conditions | UV exposed dose after wiring | 0.1 J/cm$^2$ | 0.5 J/cm$^2$ | 1 J/cm$^2$ | 1 J/cm$^2$ |
|  | Press temperature | 130° C. | 130° C. | 130° C. | 160° C. |
|  | UV exposed dose after press | 3 J/cm$^2$ | 3 J/cm$^2$ | 3 J/cm$^2$ | 3 J/cm$^2$ |
| Properties | Positional precision of wires | x | o | o | o |
|  | Voids | o | o | x | x |

The positions of wired wires and the cross-sections of cut were tested. The positional shift of wired wires in Example 4 and Comparative Examples 11 and 12 were 50 μm or less, thus evaluated as ○ in Table 2.

In contrast, the positional shift of wires in Comparative Example 10 was more than 200 μm, thus evaluated as x in Table 2.
[Voids]

After observing with the naked eye cross-sections of Example 4 and Comparative Example 10, no voids were found in the adhesive layers. In contrast, in comparative Examples 11 and 12, large voids of about 50 μm were found in numbers of 5 and 30, respectively per 10 cm of the adhesive layers. This was evaluated as x in Table 2.

As mentioned above, by using the special adhesive of the present invention, the producing process for providing excellent positional precision of wires and inhibition of generation of voids can be established.

EXAMPLE 5, COMPARATIVE EXAMPLES 13 AND 14

Using the same adhesive composition as used in Example 1 except for using Phenotohto YP-50 (mfd. by Tohto Kasei Co., Ltd.) in place of Epikote 1010 and under the same production conditions as described in Example 1 except for process conditions (4) listed in Table 3, multiple wire wiring boards were produced.

The positional precision of wires and prevention of voids were tested under the conditions mentioned above. The results are shown in Table 3.

TABLE 3

| | | Comparative Example 13 | Example 5 Reference No. | Comparative Example 14 |
|---|---|---|---|---|
| | | 1 | 2 | 3 |
| Conditions | UV exposed dose after wiring | 0.1 J/cm$^2$ | 0.5 J/cm$^2$ | 1 J/cm$^2$ |
| | Press temperature | 130° C. | 130° C. | 130° C. |
| | UV exposed dose after press | 3 J/cm$^2$ | 3 J/cm$^2$ | 3 J/cm$^2$ |
| Properties | Positional precision of wires | x | o | o |
| | Voids | o | o | x |

COMPARATIVE EXAMPLES 15 TO 17

Using the same adhesive composition as used in Comparative Example 7 except for using Phenotohto YP-50 (mfd. by tohto Kasei Co., Ltd.) in place of Epikote 1010 and under the same conditions as described in Example 1 except for process conditions (4) listed in Table 4, multiple wire wiring boards were produced.

The positional precision of wires and prevention of voids were tested under the conditions mentioned above. The results are shown in Table 4.

TABLE 4

| | | Comparative Example No. | | |
|---|---|---|---|---|
| | | 15 | 16 Reference No. | 17 |
| | | 1 | 2 | 3 |
| Conditions | UV exposed dose after wiring | 0.1 J/cm$^2$ | 0.5 J/cm$^2$ | 1 J/cm$^2$ |
| | Press temperature | 130° C. | 130° C. | 130° C. |
| | UV exposed dose after press | 3 J/cm$^2$ | 3 J/cm$^2$ | 3 J/cm$^2$ |
| Properties | Positional precision of wires | x | o | o |
| | Voids | o | o | x |

As shown in Table 4, no conditions are found for satisfying both the improvement of positional precision of wires and inhibition of generation of voids. Better conditions seems to be present between the conditions 2 and 3, but since no component (c) is present, such a region is very narrow or not present.

As mentioned above, according to the present invention, the cured adhesive layer has Tg of 110° C. or higher and difficult to be smelled by organic solvents. Further, the multiple wire wiring boards of the present invention do not contain voids in the adhesive layer in which encapsulated wires are wired and fixed, and have high reliability with high wiring density due to almost no shift of wires.

We claim:

1. A multiple wire wiring board comprising a substrate having a conductor circuit thereon or insulating substrate, an adhesive layer formed on one or both surfaces of the substrate, said adhesive layer being formed of an adhesive comprising (a) an epoxy resin having a molecular weight of 5000 or more and being solid at room temperature, (b) a polyfunctional epoxy resin having at least three epoxy groups, (c) an intramolecular epoxy modified polybutadiene having at least three epoxy groups, (d) a cationic photopolymerization initiator, and (e) a tin compound, wherein the weight ratio of (a+b+c) to (a) is 100:40 to 100:70, the weight ratio of (a+b+c) to (b) is larger than 100:10, the weight ratio of (a+b+c) to (c) is 100:10 to 100:40 and the weight ratio of (a+b+c) to (d) is 100:0.5 to 100:5 insulated encapsulated wires fixed on the adhesive layer through holes formed in necessary portions of the substrate, and conductor circuits formed on necessary portions of outmost surfaces of the substrate.

2. A wiring board according to claim 1, wherein the adhesive layer is formed by using an adhesive further comprising (g) an epoxy resin which is liquid at room temperature.

* * * * *